(12) United States Patent
Kumar et al.

(10) Patent No.: US 11,581,058 B2
(45) Date of Patent: Feb. 14, 2023

(54) ADAPTIVE READ DISTURB ALGORITHM FOR NAND STORAGE ACCOUNTING FOR LAYER-BASED EFFECT

(71) Applicant: PetaIO Inc., Santa Clara, CA (US)

(72) Inventors: Naveen Kumar, San Jose, CA (US); Seok Lee, San Jose, CA (US); LingQi Zeng, San Jose, CA (US)

(73) Assignee: PETAIO INC., Santa Clara, CA (US)

( * ) Notice: Subject to any disclaimer, the term of this patent is extended or adjusted under 35 U.S.C. 154(b) by 0 days.

(21) Appl. No.: 17/322,543

(22) Filed: May 17, 2021

(65) Prior Publication Data

US 2022/0366999 A1 Nov. 17, 2022

(51) Int. Cl.
| | |
|---|---|
| G11C 29/46 | (2006.01) |
| G11C 29/36 | (2006.01) |
| G11C 29/44 | (2006.01) |
| G11C 16/26 | (2006.01) |
| G11C 16/34 | (2006.01) |
| G11C 16/10 | (2006.01) |
| G11C 16/16 | (2006.01) |
| G11C 29/42 | (2006.01) |

(52) U.S. Cl.
CPC ............ *G11C 29/46* (2013.01); *G11C 16/102* (2013.01); *G11C 16/16* (2013.01); *G11C 16/26* (2013.01); *G11C 16/3495* (2013.01); *G11C 29/36* (2013.01); *G11C 29/42* (2013.01); *G11C 29/4401* (2013.01)

(58) Field of Classification Search
CPC ....... G11C 29/46; G11C 16/102; G11C 16/16; G11C 16/26; G11C 16/3495; G11C 29/36; G11C 29/42; G11C 29/4401
See application file for complete search history.

(56) References Cited

U.S. PATENT DOCUMENTS

| | | | | |
|---|---|---|---|---|
| 9,361,997 | B2* | 6/2016 | Lee | G11C 16/10 |
| 9,613,687 | B2* | 4/2017 | Kim | G06F 11/1012 |
| 2016/0041760 | A1* | 2/2016 | Kuang | G11C 16/3495 |
| | | | | 711/103 |

* cited by examiner

*Primary Examiner* — Vanthu T Nguyen
(74) *Attorney, Agent, or Firm* — Stevens Law Group; David R. Stevens

(57) ABSTRACT

A storage device includes 3D NAND including layers of multi-level cells. Test reads are performed by reading only LSB pages and reading layers in a repeating pattern of reading two and skipping two. A test read of a block is performed when its read count reaches a threshold. The counter threshold is updated according to errors detected during the test read such that the frequency of test reads increases with increase in errors detected. Counter thresholds according to errors may be specified in a table. The table may be selected as corresponding to a range of PEC values including the current PEC count of the 3D NAND. Each table further specifies a number of errors that will result in garbage collection being performed.

7 Claims, 5 Drawing Sheets

US 11,581,058 B2

ADAPTIVE READ DISTURB ALGORITHM FOR NAND STORAGE ACCOUNTING FOR LAYER-BASED EFFECT

BACKGROUND

Field of the Invention

This invention relates to systems and methods for managing data corruption resulting from read disturbance in NAND storage devices.

Background of the Invention

When reading data from a NAND storage devices, an elevated voltage is applied to a block containing a wordline being read. Over many read cycles, this can result in corruption of the data stored in the block, which is referred to as "read disturb." There are various ways to track read disturb counts on blocks. The most naïve way to track the read disturb will be to track number of read commands executed on a superblock including a set of blocks grouped together for tracking purposes. When the count reaches a threshold, the superblock can then be garbage collected. In this approach, the threshold is chosen aggressively because a coarse threshold can allow for a large error rate in blocks of the superblock. However, the key disadvantage of this scheme is that the superblock will be garbage collected quite often with an aggressive threshold selection.

It would be an advancement in the art to provide an improved approach for dealing with read disturb in NAND storage devices.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
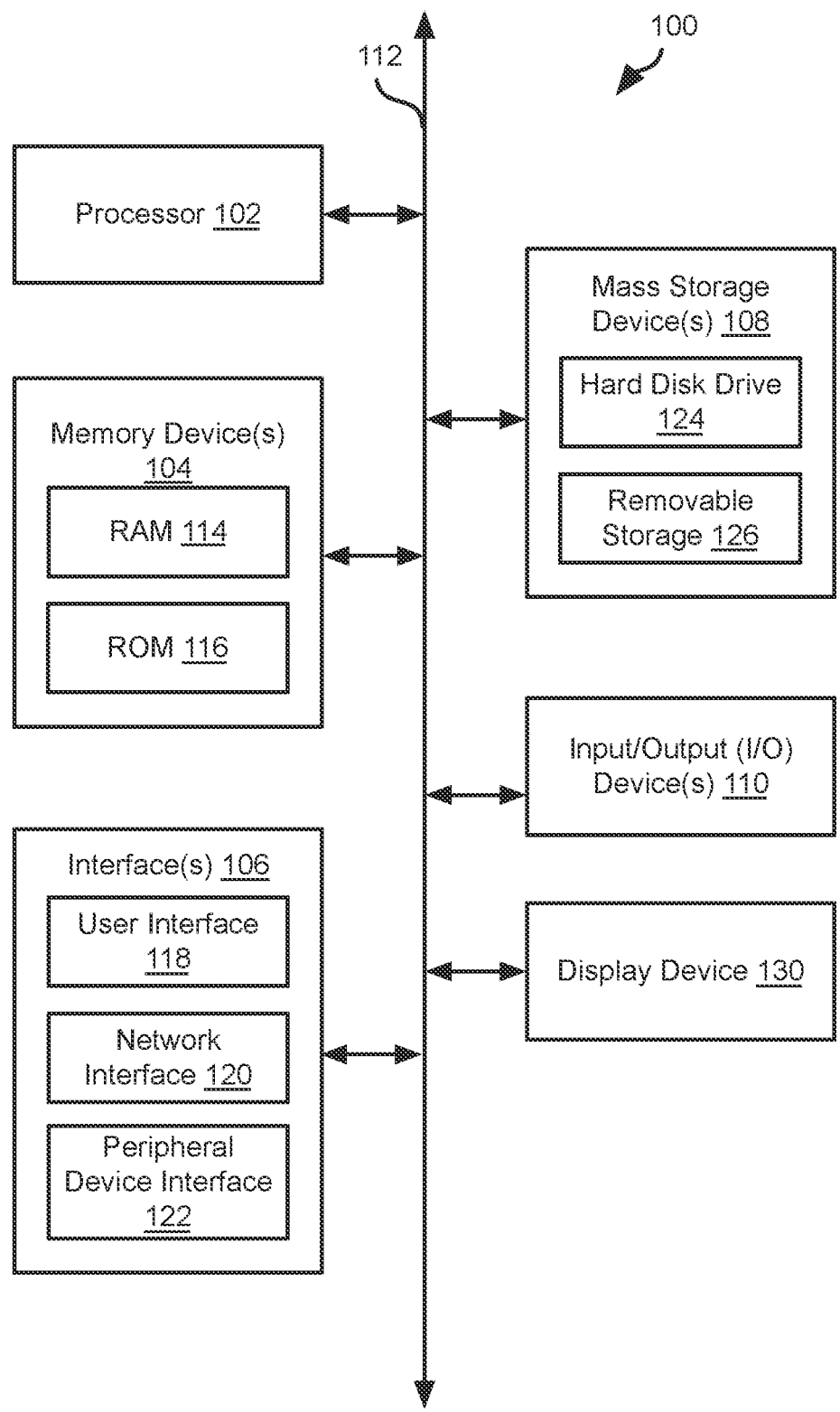
FIG. 1 is a schematic block diagram of a computing system suitable for implementing an approach in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
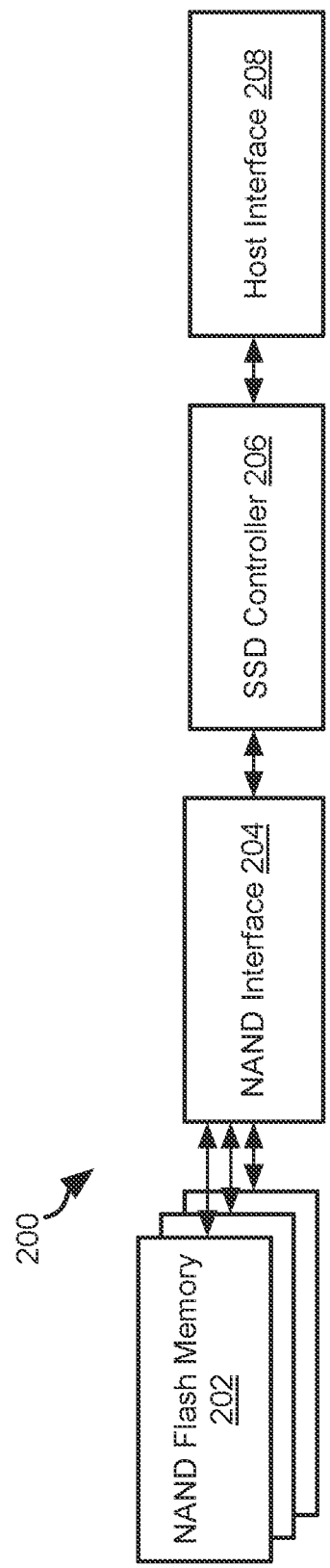
FIG. 2 is a schematic block diagram of components of a storage system that may implement an approach in accordance with an embodiment of the present invention.

Referring to FIG. 2, a typically flash storage system 200 includes a solid state drive (SSD) that may include a plurality of NAND flash memory devices 202. One or more NAND devices 202 may interface with a NAND interface 204 that interacts with an SSD controller 206. The SSD controller 206 may receive read and write instructions from a host interface 208 implemented on or for a host device, such as a device including some or all of the attributes of the computing device 100. The host interface 208 may be a data bus, memory controller, or other components of an input/output system of a computing device, such as the computing device 100 of FIG. 1.

The methods described below may be performed by the SSD controller 206, the host interface 208, or a combination of the two. The methods described herein may be executed by any component in such a storage device or be performed completely or partially by a host processor coupled to the storage device.

The system and method described below enables the tracking of the read disturb effect on blocks of a NAND storage device and enables garbage collection (GC) to be performed in a proactive and adaptive manner in order to reduce degradation of quality of service (QoS) of the NAND storage device. The system and method described below reduces both the number of evaluations of blocks of the NAND storage device and the number of test reads per evaluation. This reduces contention with normal read commands. At the same time, GC is performed based on error thresholds to avoid non-recoverable amounts of errors.

The NAND storage device described herein may comprise storage cells that may store multiple levels of charge, such as eight levels to achieve a three bits per cell. An array of storage cells may be arranged in wordlines, with a wordline being the smallest unit of memory that may be read. Each wordline may be arranged on multiple plane, such as two planes. The planes of wordlines may be arranged in layers, such as four layers per block. A set of blocks may be arranged in super blocks. An erase cycle or GC operation must be performed for an entire superblock and cannot be performed for an individual block or wordline.

Table 1 illustrates an example structure of a three-dimensional (3D) NAND storage device. Each wordline comprises two parts WL(x,y,z), where x identifies the layer of the wordline, y is the index of the wordline, and z indicates the plane storing that part of a wordline. Accordingly, a single wordline comprises W(x,y,0) and W(x,y,1). Each part WL(x,y,z) may store multiple bytes of data in multiple multi-level cells. For example, in one example device each part WL(x, y,z) stores three pages of 16K cells.

TABLE 1

Layer Structure of NAND Storage Device.

| Layer 0 | Plane 0 | Plane 1 |
|---|---|---|
| | WL(0,0,0) | WL(0,0,1) |
| | WL(0,1,0) | WL(O,1,1) |
| | WL(0,2,0) | WL(0,2,1) |
| | WL(0,3,0) | WL(0,3,l) |
| Layer 1 | Plane 0 | Plane 1 |
| | WL(1,0,0) | WL(1,0,1) |
| | WL(1,1,O) | WL(1,1,1) |
| | WL(l,2,0) | WL(1,2,1) |
| | WL(l,3,0) | WL(1,3,1) |
| Layer 2 | Plane 0 | Plane 1 |
| | WL(2,0,0) | WL(2,0,l) |
| | WL(2,1,0) | WL(2,1,1) |
| | WL(2,2,0) | WL(2,2,1) |
| | WL(2,3,0) | WL(2,3,1) |

During read intensive workloads in an SSD drive, there is a read disturb phenomenon observed which affects the reliability of the data significantly. When a read command is executed on a particular wordline in a block (e.g., WL(1,1,0) and WL (1,1,1) in Table 1) a higher voltage is applied in all the other wordlines in the block except the one wordline which is being read. Thus, during the read operation cells programmed in other wordlines get charged up which may introduce data errors. The read disturb is most pronounced for adjacent layers. For example, for reads of WL(1,1,1), WL(1,1,0), the read disturb will most greatly affect WL(0, x,y) and WL(2,x,y) (see discussion of FIG. 4, below).

Read disturb can significantly affect quality of service (QoS) of the drive as the read commands can take longer time to decode for blocks having experienced prominent read disturb. If the condition of the drive is at end of life with extreme test conditions, read disturb errors will be difficult to decode even with soft decoding. The adaptive read disturb algorithm described herein can provide better drive performance in varying conditions of the drive.

The read disturb algorithm described herein may include tracking the number of read commands on particular blocks. For this task, counters may be implemented for tracking read commands for L blocks, where L is an integer greater than or equal to 1. The following notations may be used to describe the implementation of counters:

B=Number of blocks in a drive
L=Number of blocks per counter
W=bit width of counter in bytes
$N_c$=Number of Counters=(B/L)
$V_c$=value of counter As is readily apparent, there is a tradeoff in terms the storage of counters and garbage collection frequency for the blocks. If the number of blocks per counter (L) is lower, implying higher counter storage, one can track read commands executed on a smaller number of blocks and garbage collect at a slower pace. However, if the value of L is higher, implying lower counter storage, there will be a higher frequency of garbage collection. The number of counters may therefore be selected to obtain an acceptable garbage collection frequency. These parameters may be selected experimentally and may be limited by the storage space available on spare SRAM or DRAM available in SSDs 200, such as the in the SSD controller 206.

For a given configuration of read counters for tracking read commands, thresholds for the counter values may be defined according to the read disturb algorithm described herein. The value of a read counter may be used to determine when to check the health of the one or more blocks for which the read counter tracks read values. Checking the health of the one or more blocks may include performing test reads. Performing test reads can be costly as test reads will interfere with normal read commands and can substantially reduce input output operations (IOPs) for the SSD 200. The read disturb algorithm described herein enables a drastic reduction in the number of test reads.

Figure 3:
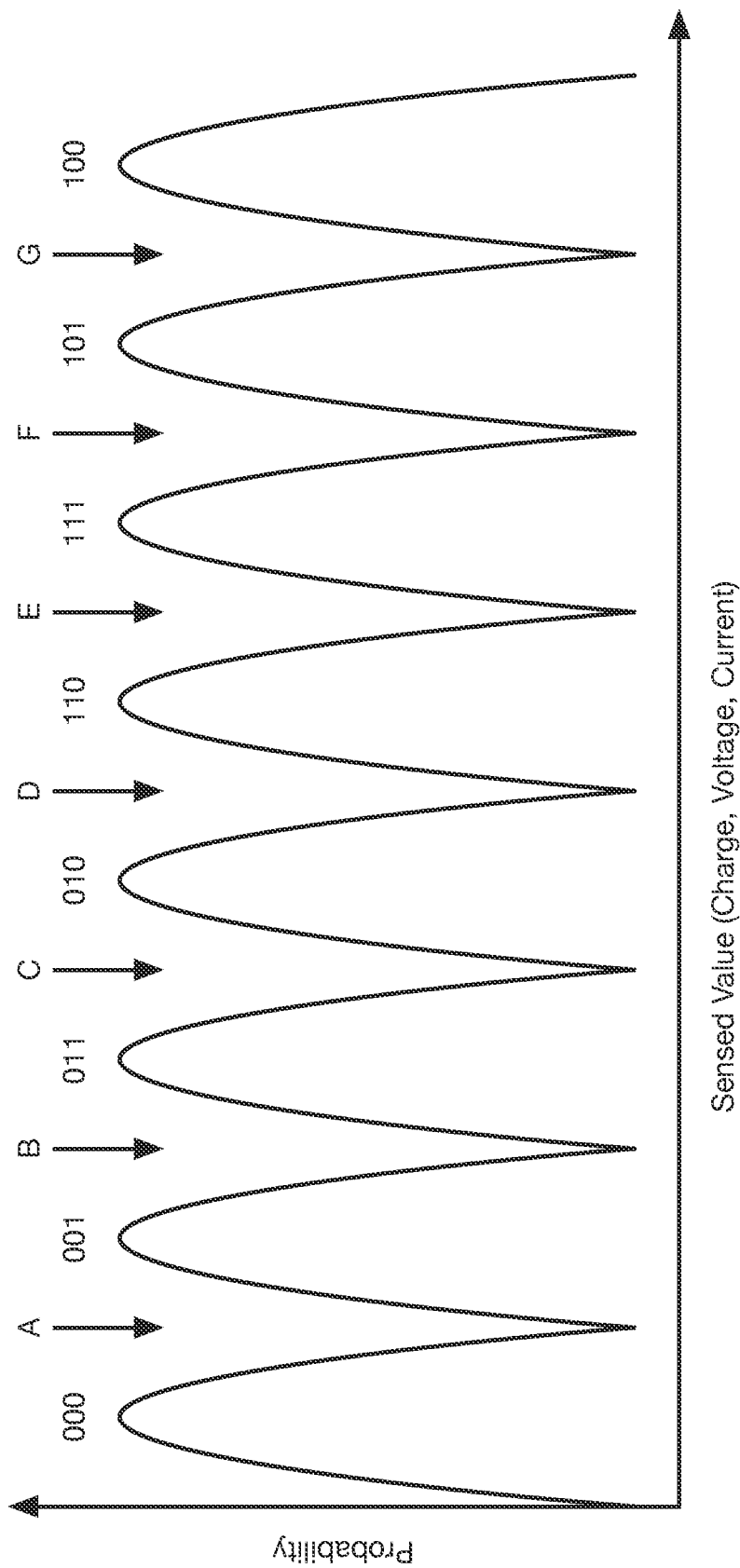
FIG. 3 is a plot showing probability distributions of sensed values, thresholds, and bit assignments for cells of the NAND device.

Referring to FIG. 3, storage of data within a multi-level cell may be understood with respect to the illustrated plot of a sensed value (e.g., charge, voltage, or current) for a given cell and the probability distribution for that sensed value. In particular, when charging the cell to a particular level, there may be some variability such that the sensed value for a given level corresponds to the illustrated probability distributions.

Thresholds (A, B, C, D, E, F, G) may be defined such that sensed values may be decoded into bit words, such as three bit words in the illustrated example. The bit words assigned with respect to the thresholds may be selected such that only one bit changes across each threshold boundary. In the illustrated example, sensed values below threshold A are decoded as 000; sensed values between A and B are decoded as 001; sensed values between B and C are decoded as 011; sensed values between C and D are decoded as 010; sensed values between D and E are decoded as 110; sensed values between E and F are decoded as 111; sensed values between F and G are decoded as 101; and sensed values above G are decoded as 100. These encoding is exemplary only and other arrangements may also be used.

Threshold A defines the boundary between 000 and 001. Accordingly, increase in the sensed value resulting from read disturb will result in 000 transitioning to 001, i.e. the least significant bit (LSB) of the decoded word is the most likely to be incorrect as a result of read disturb. As used herein LSB refers to the rightmost bit of a decoded word, center significant bit (CSB) refers to the center bit, and MSB refers to the leftmost bit.

Figure 4:
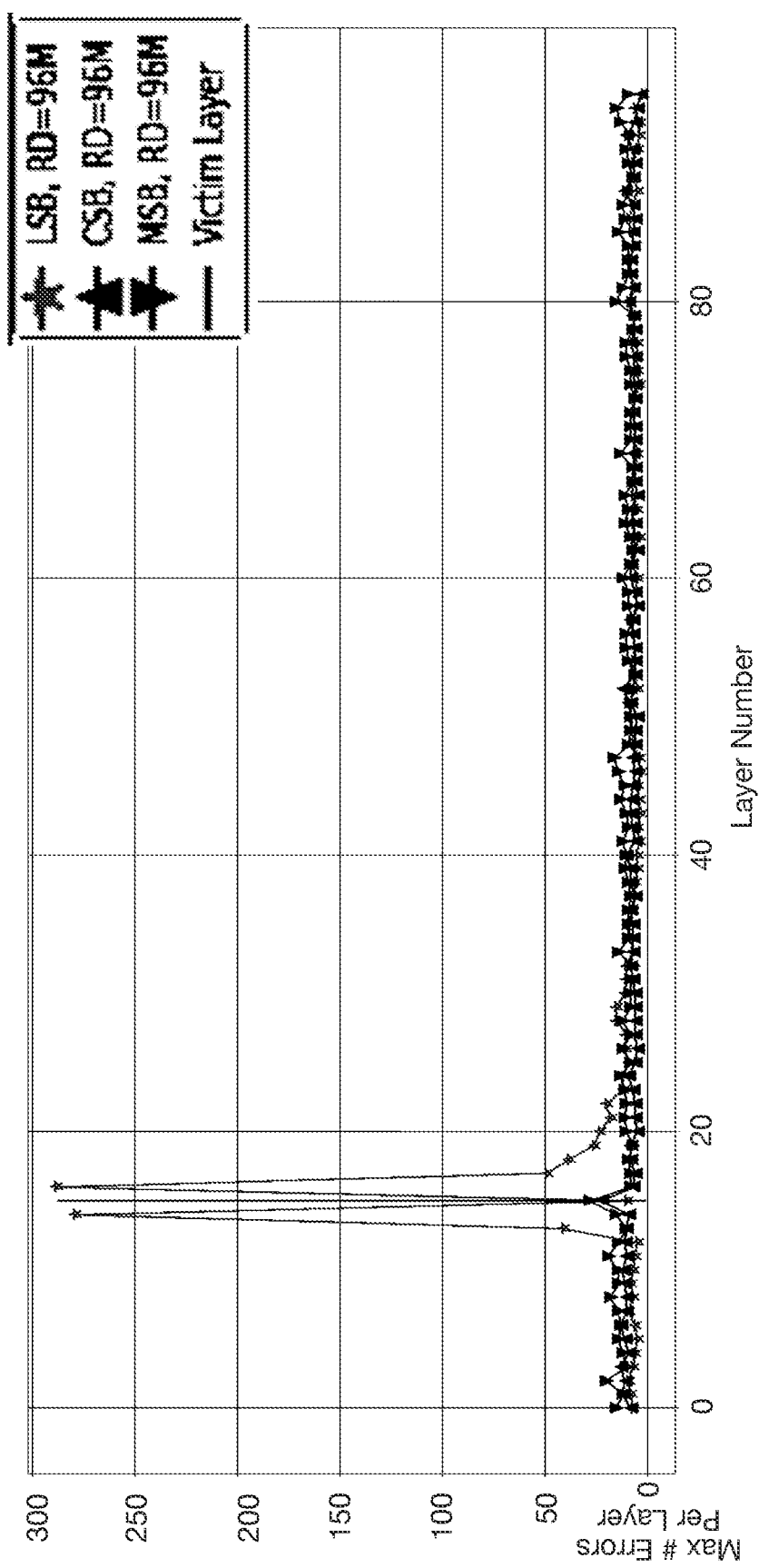
FIG. 4 is plot showing a distribution of bit errors among bit positions and layers of a NAND device resulting from reading a particular victim line of the NAND device.

FIG. 4 illustrates a plot of errors per layer of a NAND device resulting from read disturb. The plot measures error with respect to a 3D NAND storage device, such as one having the structure shown in Table 1. The plot shows the maximum number of errors per layer for the LSB, CSB, and MSB of the 3D NAND storage device. The illustrated plot was obtained after performing 96 million reads on a victim wordline in a victim layer (layer 16).

As is apparent, the most significant errors occurred in the LSBs of the layers immediately adjacent the victim layer (layers 15 and 17) whereas bit errors for the CSB and MSB of all layers were not significant. Likewise, the bit errors for the LSB of the non-adjacent layers were insignificant.

Accordingly, when it is determined to perform test reads on a block according to the read disturb algorithm (see FIG. 5 and associated description), the test reads may be performed as follows:

i=0;
read_Nth_layer=1
while i<N
read LSB pages of layer i;
if i<N−1, read LSB pages of layer i+1;
if i+1==N, read_Nth_layer=0;

i=i+4
endwhile
if read_Nth_layer=1, read LSB pages of Nth layer;

In other words: read LSB pages of two layers, skip the next two layers, read two layers, skip two layers, etc. Reading only the LSB pages is sufficient inasmuch as the LSB pages are affected first and most significantly by read disturb. The skipping of layers is possible in view of the phenomenon shown in FIG. 4: the layers impacted by errors caused by read disturb occur in sets of three contiguous layers: the victim layer and the two adjacent layers. By testing two layers and leaving gaps of two layers, test reads will be performed on at least one of these layers and the impact of read disturb will be detected. Note that the last layer of 3D NAND devices typically has the highest bit error rate (BER). Accordingly, the algorithm may perform a test read on the last layer in every instance regardless of the skipping pattern.

The above-described approach to performing test reads results in reading only ⅓ of each layer due to reading only the LSB pages and reading only about ½ of the layers due to skipping ("about" is used to indicate some variation from ½ in the case that the number of layers is not a multiple of 4) Accordingly, only ⅙$^{th}$ of the test reads are performed. In either case, the number of test reads is drastically reduced, which improves the performance of the SSD 200. For example, supposing a block of 96 layers, with four wordlines per layer, 4K pages per plane, two planes per layer, and three bits per cell, the number of pages is reduced from 9216 K to 1536 K.

Figure 5:
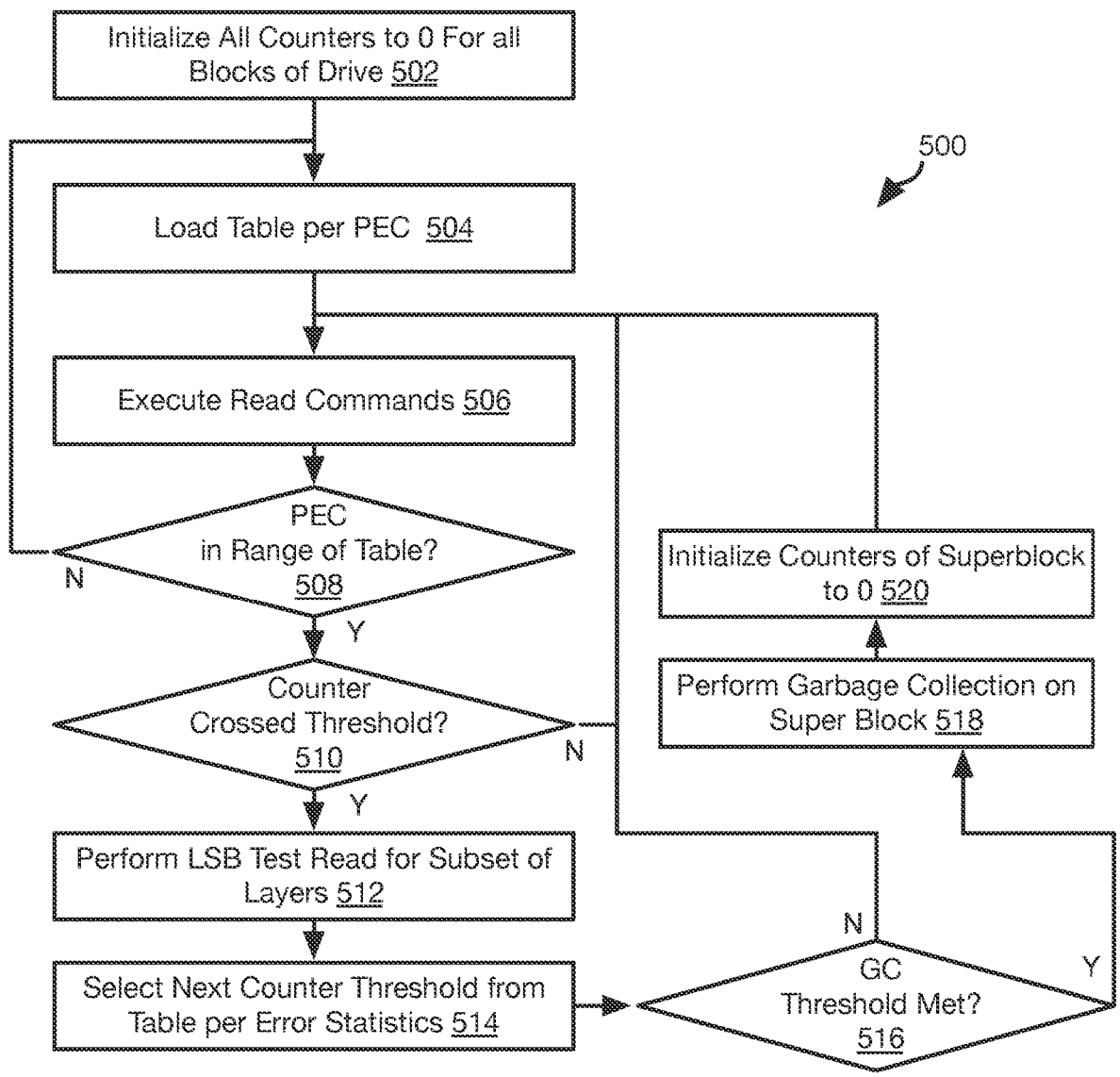
FIG. 5 is process flow diagram of a method for implementing adaptive read counter thresholds for performing test reads and garbage collection in accordance with an embodiment of the present invention.

FIG. 5 illustrates a method 500 for selecting thresholds for counters to determine when to perform test reads and garbage collection. The method 500 may be used with the approach described above for reducing the number of test reads when evaluating a block. The method 500 may also be used with conventional approaches for performing test reads, e.g. reading every wordline of every layer.

The method 500 may use statistics of errors occurring in a block as collected during normal read command operation of the SSD 200. In a normal read command operation, data read from the SSD 200 is processed by an error control coding (ECC) decoder. The ECC decoder in some SSD 200 provides some statistical data in the form of outputting a bin number indicating that the number of errors falls within a range of values represented by that bin number. For example, suppose there are three thresholds: 100, 150, and 200 errors per codeword, where a codeword is a string of bits that were encoded according to an ECC algorithm such that one or more bits of that string of bits may be recovered by the ECC decoder. In some embodiments, the string of bits is the size of a page. Accordingly, along with the decoded output for a read page, the ECC decoder may produce a two bit output indicating that the number of errors detected in that page belongs in one of four bins: b00 for [0,100] errors, b01 for [100,150] errors, b10 for [150, 200] errors, and b11 for [200 (i.e. 200 or more). As used herein, the notation of the form [a, b] to describe a range may be interpreted as "from a to b −1" such that there is no overlap between [a, b] and [b, c].

The upper threshold and the corresponding bin (200 or greater in the example above) may be dependent on the correction capability of the ECC decoder guaranteeing a specified QoS. Other configurations may be used, such as different thresholds and different number of bins.

When performing a test read on a block or group of blocks, statistics may be collected in the form of the number of occurrences of each bin value, e.g. the number of occurrences of each two bit value in the example described above. For example, where only LSB pages are read, the statistics may include:

The number of LSB pages decoded having errors in [0,100]
The number of LSB pages decoded having errors in [100,150]
The number of LSB pages decoded having errors in [150,200]
The number of LSB pages decoded having errors >200.

Where test reads for two more pages (MSB, CSB, and LSB) are performed, statistics for all of the two or more pages may be aggregated in a like manner.

The method 500 may further make use of one or more tables defining thresholds used to select counter thresholds based on the above-described statistics. Multiple tables may be defined, each table corresponding to a different range of program erase cycles (PEC) to which the NAND storage device has been subject.

For example, Table 2 may be used for a device having a PEC from 0 to less than 5,000. Table 3 may be used for a device having PEC from 5,000 to 10,000. Each row is an entry in which the left value describes a condition met by the error statistics of a test read (or a default first test threshold where a test read has not yet been performed) and each the right value describes an increment to a counter threshold to apply if the condition is met.

TABLE 2

| Thresholds for PEC from 0 to 5,000 | |
| --- | --- |
| First test threshold | 5M |
| Statistics | Frequency (Number of Reads Between Test Reads) |
| >100 = 0%, [0,100] = 100% | 4M |
| >150 = 0%, 0 < [100,150] < 1% | 2M |
| >150 = 0%, [100,150] >1% | 1M |
| >200 = 0%, 0 < [150,200] < 1% | 1M |
| >200 = 0%, [150,200] > 1% | 500K |
| >200 != 0% | Garbage Collect |

TABLE 3

| Thresholds for PEC from 5,000 to 10,000 | |
| --- | --- |
| First test threshold | 1M |
| Statistics | Frequency (Number of Reads Between Test Reads) |
| >100 = 0%, [0,100] = 100% | 2M |
| >150 = 0%, 0 < [100,150] < 1% | 1M |
| >150 = 0%, [100,150] >1% | 500K |
| >200 = 0%, 0 < [150,200] < 1% | 500K |
| >200 = 0%, [150,200] > 1% | 250K |
| >200 != 0% | Garbage Collect |

Some entries of Table 2 and Table 3 are of the form of ">A=0%, [B, C] (=,<, or >) X %," which may be understood as: the number of pages with a number of errors greater than A is equal to 0% of the total number of pages of the one or more blocks, the number of pages with errors greater than or equal to B and less than C is (equal to, less than, or greater than) X % of the total number of pages of the one or more blocks.

Tables 1 and 2 illustrate a number of features of the read disturb algorithm. First, the first test read of a block is conducted at a higher counter threshold at the early life of the drive (PEC in [0,5000]) compared to mid to end life of the drive (PEC in [5000,10000]). Stated differently, the amount by which the counter threshold of a block is incremented after each test read has an inverse relationship to the PEC of the drive. Second, test read frequencies change based on the number of errors observed from the block. If the block is not significantly affected by the read disturb, the test read frequency is slower, e.g. every 4M reads in the early life of the drive. In contrast, the test frequency becomes greater if more errors are found in the error statistics of the block. Stated differently, the amount by which the counter threshold of a block is incremented after each test read has an inverse relationship to the number of errors detected during each test read. Third, if the error statistic thresholds for selecting test read frequency are compared for the early life and the end of life of the drive, test read frequency is higher near the end of the life of the drive at all conditions of the error statistics such that the health of the block is evaluated more closely at the end of the life of the NAND storage device.

For example, with reference to Table 1, where the PEC is in the range [0,5000]. The first test read of a block or group of blocks will be conducted once the read counter for the block or group of blocks reaches 5M reads. Supposing the first test read shows the number errors to be such that the number of pages with errors in the range [100,150] is greater than 1%. In that case, the next test read will be conducted at 6M (5M+1M) read disturb (RD). At 6M RD, if the test read statistics shows that the bin >200 is nonzero (the garbage collection threshold), the superblock containing any blocks or groups of blocks crossing the garbage collection threshold will be garbage collected and the read counters of all blocks of the superblock will be reset to 0.

Although two tables are shown for two ranges of PEC values, there may be three or more tables. In other embodiments, a single table is used that still achieves the benefit of selecting thresholds based on the number of errors detected. The counter thresholds for a given table may be determined experimentally for a given design of a NAND storage device. For example, the device may be subject to a test routine including repeatedly performing writes with known data, reads, and garbage collection. Errors in the read data may be determined for each read given the known data. The number of errors may be tracked throughout the test and thresholds may be detected such that the number of errors that occur will have a high probability (e.g., 99.9% or other value) of remaining below the number correctible using the ECC algorithm.

As shown in FIG. 5, an example method 500 for implementing the read disturb algorithm may include initializing 502 read counters to 0 for all blocks of an SSD 200. In the following description, it is assumed that each block has its own counter. The method may also be used with one counter counting reads for multiple blocks such that reads for the multiple blocks are counted by the counter. The method 500 is described as being performed for a single block as the subject block of the method. The method 500 may be performed in the same manner with a group of blocks and a counter for a groups of blocks taking the place of the block and the counter for the block.

The method 500 may include loading 504 a table, such as a table including a first test read counter threshold and error statistic thresholds as described above with respect to Tables 2 and 3. The table loaded may be the table corresponding to the current PEC value of the SSD 200. The PEC of the SSD 200 may be maintained by the SSD 200 and readable by the executable code performing the method 500 such that updating of the PEC need not be performed by the read disturb algorithm. Loading a table 504 may include setting a read counter threshold for each block based on current values of the counters for each block and the table. For a first iteration of step 504, this will be the first entry in the table.

The method 500 may include executing read commands 506. Executing read commands 506 may include incrementing (+1) the counter of a block with respect to which each read command is executed. Interleaved with executing 506 the read commands, the method 500 may include evaluating 508 the PEC of the SSD 200 and evaluating 510 the states of the counters for the blocks with respect to the read counter threshold indicated by the table loaded at step 504. The evaluating of steps 508 and 510 may be performed periodically, e.g., based on a timer, every N reads (where N is a preconfigured value), or based on some other criteria.

If the PEC is found 508 to exceed the range corresponding to the table loaded at step 504, then processing returns to step 504 with the loading of a new table corresponding to a range of PEC values including the current PEC of the SSD 200.

The evaluation of step 510 includes evaluating the counter for each block with respect to the counter threshold for that block. If the counter of a block has not crossed the counter threshold, then processing continues at step 506 with further processing of read commands.

If the counter of a block is found 510 to have crossed the counter threshold, then a test read is performed 512. In some embodiments, this is a partial test read as described above in which only LSB pages are read and layers are skipped (e.g., a pattern of reading two layers and skipping two layers while always reading the last layer). However, the method 500 may also be performed using other approaches for performing test reads, such as a full test read of all pages of the block. As the test read of the block is performed, error statistics are gathered, which may include counting the number of occurrences of each bin number reported by the ECC decoder as described above. The read counter for a each block may be incremented for each test read.

The method 500 may include selecting 514 the next counter threshold according to the table loaded at step 504 based on the error statistics. In some embodiments, the read counter for a block are not zeroed at each test read, such that step 514 includes adding the frequency value to the current counter threshold to obtain an updated counter threshold, the frequency value being the frequency value in the entry of the table matching the error statistics from the test read.

If the error statistics are found 516 to be below the GC threshold (e.g., the last entry in Table 2 or Table 3), then processing continues at step 506 with the processing of additional read commands until the new counter threshold is found 510 to be crossed.

If the error statistics are found 516 to meet the GC threshold, then garbage collection is performed 518 for the block and all other blocks in the super block including the block meeting the GC threshold. The read counters of all blocks in the super block may then be set to zero and processing may continue at step 504.

The present invention may be embodied in other specific forms without departing from its spirit or essential characteristics. The described embodiments are to be considered in all respects only as illustrative, and not restrictive. In particular, although the methods are described with respect to a NAND flash SSD, other SSD devices or non-volatile storage devices such as hard disk drives may also benefit from the methods disclosed herein. The scope of the invention is, therefore, indicated by the appended claims, rather than by the foregoing description. All changes which come within the meaning and range of equivalency of the claims are to be embraced within their scope.

What is claimed is:

1. A storage device comprising:
a NAND storage device comprising a plurality of blocks of storage; and
a controller coupled to the NAND storage device and programmed to perform a test read of a subject block of the plurality of blocks of storage by reading only pages corresponding to one bit position;
wherein NAND storage device comprises a plurality of layers, the controller being programmed to perform the test read of the subject block by reading the plurality of layers in a repeating pattern including reading two layers and skipping two layers and reading a last layer of the plurality of layers wherein the controller is programmed to:
receive, from an error control code (ECC) decoder, a bin number indicating a range of error numbers for each page of the subject block read during the test read;
compile statistics for each bin number;
evaluate the statistics with respect to a table; and
update the counter threshold according to the evaluation of the statistics with respect to the table
wherein the controller is programmed to perform the test read when a test condition is met with respect to the subject block, the test condition being a number of reads recorded in a read counter for the subject block reaching a counter threshold for the subject block
wherein the controller is programmed to update the counter threshold based on a number of errors detected during the test read.

2. A storage device comprising:
a NAND storage device comprising a plurality of blocks of storage; and
a controller coupled to the NAND storage device and programmed to process each block of storage of the plurality of blocks of storage as a subject block by:
record in a read counter a number for the subject block of storage a number of reads performed with respect to the subject block;
when the read counter reaches a counter threshold, perform a test read of the subject block;
evaluate error statistics for the test read of the subject block; and
update the counter threshold for the subject block according to the evaluation of the error statistics for the test read of the subject block;
wherein the controller is programmed to: receive, from an error control code (ECC) decoder, a bin number indicating a range of error numbers for each page of the subject block read during the test read; and
compile the error statistics by counting a number of times each bin number is output by the ECC decoder during the test read.

3. The storage device of claim 2, wherein the controller is programmed to:
identify an entry in a table corresponding to the error statistics; and
increase the counter threshold by a counter threshold frequency of the entry.

4. The storage device of claim 3, wherein the controller is programmed to:
read a program/erase cycle (PEC) count for the NAND storage device; and
select the table from among a plurality of tables as being associated with a PEC range including the PEC count.

5. The storage device of claim 4, wherein the plurality of tables are such that for a given error statistic value, a first table of the plurality of tables will specify a higher counter threshold frequency than a second table of the plurality of tables having a higher associated PEC range.

6. The storage device of claim 2, wherein the controller is programmed to:
if the error statistics include any occurrences of a bin number corresponding to a maximum error count, perform garbage collection with respect to the subject block.

7. The storage device of claim 6, wherein the controller is programmed to perform garbage collection with respect to the subject block by performing garbage collection with respect to a super block including the subject block and one or more other blocks of the plurality of blocks of storage.

* * * * *